(12) United States Patent
Shieh et al.

(10) Patent No.: US 8,110,466 B2
(45) Date of Patent: Feb. 7, 2012

(54) CROSS OD FINFET PATTERNING

(75) Inventors: Ming-Feng Shieh, Yongkang (TW);
Tsung-Lin Lee, Hsin-Chu (TW);
Chang-Yun Chang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/843,728

(22) Filed: Jul. 26, 2010

(65) Prior Publication Data

US 2011/0097863 A1    Apr. 28, 2011

Related U.S. Application Data

(60) Provisional application No. 61/255,370, filed on Oct. 27, 2009.

(51) Int. Cl.
*H01L 21/428* (2006.01)

(52) U.S. Cl. ......... 438/268; 438/296; 438/197; 257/288

(58) Field of Classification Search .................. 438/706, 438/725, 738, 700, 589, 296, 268, 197; 257/329, 257/330, 622, E29.245, E21.262, 288
See application file for complete search history.

(56) References Cited

U.S. PATENT DOCUMENTS

| | | | |
|---|---|---|---|
| 6,548,859 B2 * | 4/2003 | Maegawa | 257/327 |
| 6,706,571 B1 | 3/2004 | Yu et al. | |
| 6,734,107 B2 | 5/2004 | Lai et al. | |
| 6,737,359 B1 * | 5/2004 | Yang et al. | 438/745 |
| 6,858,478 B2 | 2/2005 | Chau et al. | |
| 7,056,781 B2 * | 6/2006 | Yoon et al. | 438/197 |
| 7,190,050 B2 | 3/2007 | King et al. | |
| 7,247,887 B2 * | 7/2007 | King et al. | 257/139 |
| 7,265,008 B2 | 9/2007 | King et al. | |
| 7,291,560 B2 | 11/2007 | Parascandola et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 7,745,319 B2 * | 6/2010 | Tang et al. | 438/589 |
| 7,749,913 B2 * | 7/2010 | Omura et al. | 438/706 |
| 7,879,665 B2 * | 2/2011 | Smith et al. | 438/197 |
| 7,989,355 B2 * | 8/2011 | Shieh et al. | 438/736 |
| 7,998,813 B2 * | 8/2011 | Haller et al. | 438/258 |
| 8,003,310 B2 * | 8/2011 | Sandhu et al. | 430/323 |
| 2005/0153490 A1 | 7/2005 | Yoon et al. | |
| 2005/0285204 A1 * | 12/2005 | Kim et al. | 257/368 |
| 2006/0258162 A1 | 11/2006 | Abatchev et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |

(Continued)

*Primary Examiner* — Steven Loke
*Assistant Examiner* — David Goodwin
(74) *Attorney, Agent, or Firm* — Slater & Matsil, L.L.P.

(57) ABSTRACT

A method of forming an integrated circuit structure includes providing a semiconductor substrate; providing a first lithography mask, a second lithography mask, and a third lithography mask; forming a first mask layer over the semiconductor substrate, wherein a pattern of the first mask layer is defined using the first lithography mask; performing a first etch to the semiconductor substrate to define an active region using the first mask layer; forming a second mask layer having a plurality of mask strips over the semiconductor substrate and over the active region; forming a third mask layer over the second mask layer, wherein a middle portion of the plurality of mask strips is exposed through an opening in the third mask layer, and end portions of the plurality of mask strips are covered by the third mask layer; and performing a second etch to the semiconductor substrate through the opening.

14 Claims, 12 Drawing Sheets

U.S. PATENT DOCUMENTS

| | | |
|---|---|---|
| 2007/0128782 A1 | 6/2007 | Liu et al. |
| 2007/0132053 A1 | 6/2007 | King et al. |
| 2007/0161251 A1* | 7/2007 | Tran et al. .................. 438/725 |
| 2007/0241414 A1 | 10/2007 | Narihiro |
| 2008/0290470 A1 | 11/2008 | King et al. |
| 2008/0296632 A1 | 12/2008 | Moroz et al. |
| 2009/0181477 A1 | 7/2009 | King et al. |
| 2010/0109086 A1* | 5/2010 | Song et al. .................. 257/365 |
| 2010/0203734 A1 | 8/2010 | Shieh et al. |

* cited by examiner

CROSS OD FINFET PATTERNING

This application claims the benefit of U.S. Provisional Application No. 61/255,370 filed on Oct. 27, 2009, entitled "Cross OD FinFET Patterning," which application is hereby incorporated herein by reference.

CROSS-REFERENCE TO RELATED APPLICATION

This application relates to the following U.S. patent application: application Ser. No. 12/370,152, filed Feb. 12, 2009, and entitled "Method of Pitch Halving;" which application is hereby incorporated herein by reference.

TECHNICAL FIELD

This application relates generally to integrated circuits, and more particularly to semiconductor fins and Fin field effect transistors (FinFETs) and methods of forming the same.

BACKGROUND

With the increasing down-scaling of integrated circuits and increasingly demanding requirements to the speed of integrated circuits, transistors need to have higher drive currents with smaller dimensions. Fin field-effect transistors (FinFET) were thus developed. FinFET transistors have increased channel widths, which channels include the channels formed on the sidewalls of the fins and the channels on the top surfaces of the fins. Since the drive currents of transistors are proportional to the channel widths, the drive currents of FinFETs are increased.

To maximize the channel width of a FinFET, the FinFET may include multiple fins, with the ends of the fins connected to a same source and a same drain. In conventional processes, the formation of multi-fin FinFET include forming a plurality of fins parallel to reach other, forming a gate stack on the plurality of fins, and interconnecting the ends of the plurality of fins to form a source region and a drain region. The interconnection of the ends of the plurality of fins may be achieved through two methods. In the first method, large contact plugs are formed to interconnect the ends of the plurality of fins. In the second method, an epitaxial process is performed to grow a semiconductor material so that the ends of the plurality of fins merge with each other to form block source and drain regions. Source and drain contact plugs are then formed to connect to the block source and drain regions. These methods, however, suffer from high-cost and low-throughput problems.

SUMMARY

In accordance with one aspect of the embodiment, a method of forming an integrated circuit structure includes providing a semiconductor substrate; providing a first lithography mask, a second lithography mask, and a third lithography mask; forming a first mask layer over the semiconductor substrate, wherein a pattern of the first mask layer is defined using the first lithography mask; performing a first etch to the semiconductor substrate to define an active region using the first mask layer; forming a second mask layer having a plurality of mask strips over the semiconductor substrate and over the active region; forming a third mask layer over the second mask layer, wherein a middle portion of the plurality of mask strips is exposed through an opening in the third mask layer, and end portions of the plurality of mask strips are covered by the third mask layer; and performing a second etch to the semiconductor substrate through the opening.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

A novel method for forming fin field-effect transistor(s) (FinFET) comprising multiple semiconductor fins is provided. The intermediate stages in the manufacturing of an embodiment are illustrated. The variations of the embodiment are then discussed. Throughout the various views and illustrative embodiments, like reference numbers are used to designate like elements.

In a first embodiment, three lithography masks are used in the formation of semiconductor fins and source and drain regions (referred to as source/drain regions hereinafter) of a FinFET. The first lithography mask is used to define an active region of the FinFET, wherein the active region includes the source/drain regions and (semiconductor) fins for forming channel regions of the FinFET. The second lithography mask is used to define the pattern of the fins, while the third lithography mask is to define the boundaries of the fins.

Figure 1:
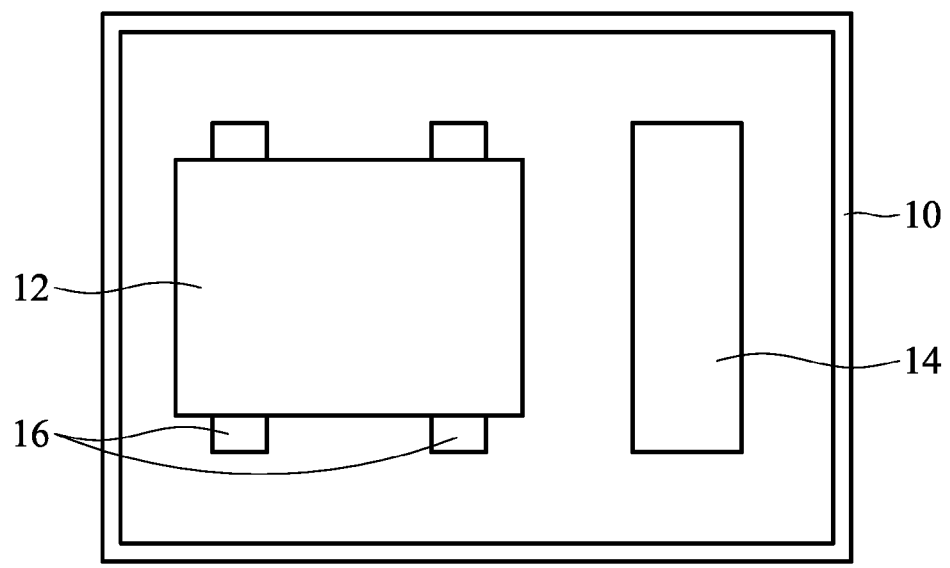
FIGS. 1 through 15 illustrate lithography masks, cross-sectional views, and top views of intermediate stages in the manufacturing of a FinFET in accordance with an embodiment.

FIGS. 1 through 5B illustrate the use of the first lithography mask to define the active region of the FinFET. FIG. 1 illustrates first lithography mask 10, which includes pattern 12 for forming the active region of the FinFET, and pattern 14 for forming a large-pitch active region. The dotted lines 16 indicate the positions of the future patterns defined using the second lithography mask. Therefore, in first lithography mask 10, the dotted patterns 16 are actually not included.

Figure 2:
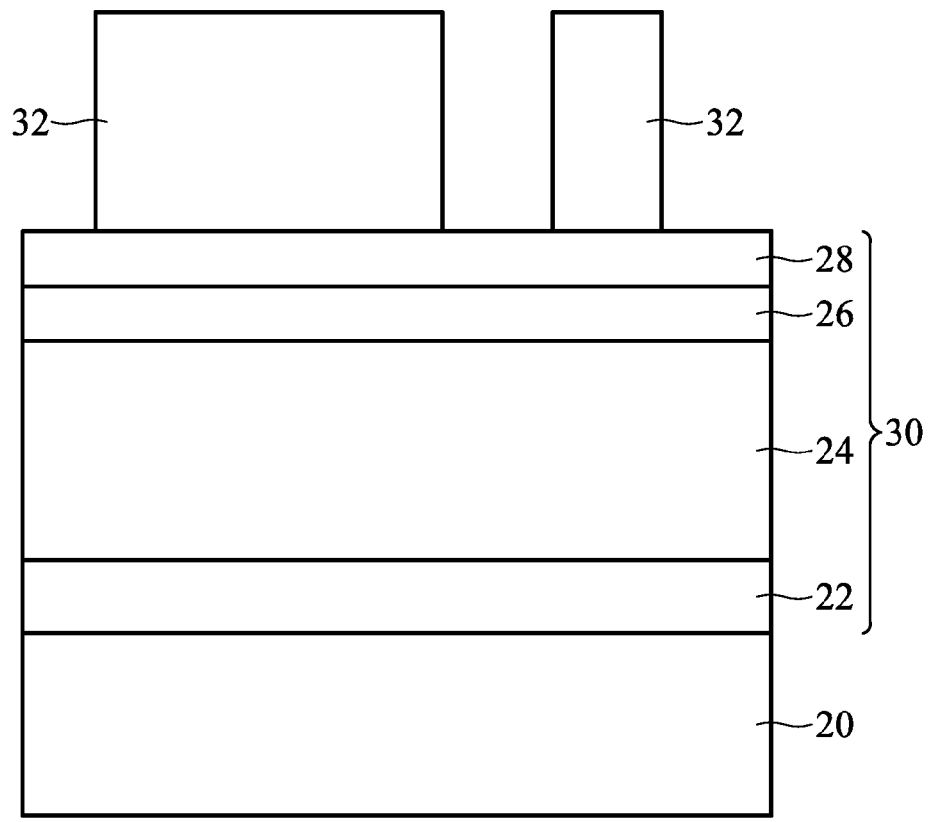

FIG. 2 illustrates a cross-sectional view of a semiconductor chip including substrate 20 and overlying layers, wherein photo resist 32 is formed using first lithography mask 10. Substrate 20 may be formed of a commonly used semiconductor material such as silicon, silicon germanium, or the like, and may be a bulk substrate or a semiconductor-on-insulator (SOI) substrate.

Hard mask 30 is formed over substrate 20. In an embodiment, hard mask 30 comprises a plurality of layers formed of different materials. For example, silicon nitride layer 22 is formed over substrate 20. Optionally, a pad oxide (not shown) may be formed between substrate 20 and silicon nitride layer 22. Amorphous carbon layer 24 is formed over silicon nitride layer 22. Plasma enhanced (PE) oxide 26, which may be a silicon oxide formed using plasma enhanced chemical vapor deposition (PECVD), is formed over amorphous carbon layer 24. Silicon oxynitride layer 28 is formed over PE oxide 26. PE oxide 26 and silicon oxynitride layer 28 are both for lithography purpose, for example, for reducing the reflection of the yellow light used in the exposure of the overlying photo resist 32. Hard mask 30 may also include additional layers (not shown) comprising, but are not limited to, an additional amorphous layer over silicon oxynitride layer 28, an additional silicon oxynitride layer over the additional amorphous carbon layer, and/or an additional bottom anti-reflective coating (ARC) over the additional silicon oxynitride layer. In an exemplary embodiment, layers 22, 24, 26, and 28 may have thicknesses equal to about 700 Å, 1400 Å, 150 Å, and 200 Å, respectively. One skilled in the art will realize, however, that the dimensions recited throughout the description are merely examples, and will change if different formation technologies are used, or the process optimization such demands.

Photo resist 32 is applied and patterned, so that the pattern of the active region of the FinFET and a large-pitch active region are defined. Photo resist 32 is exposed using first lithography mask 10 as shown in FIG. 1, and hence patterns 12 and 14 are transferred from first lithography mask 10 to photo resist 32.

Figure 3:
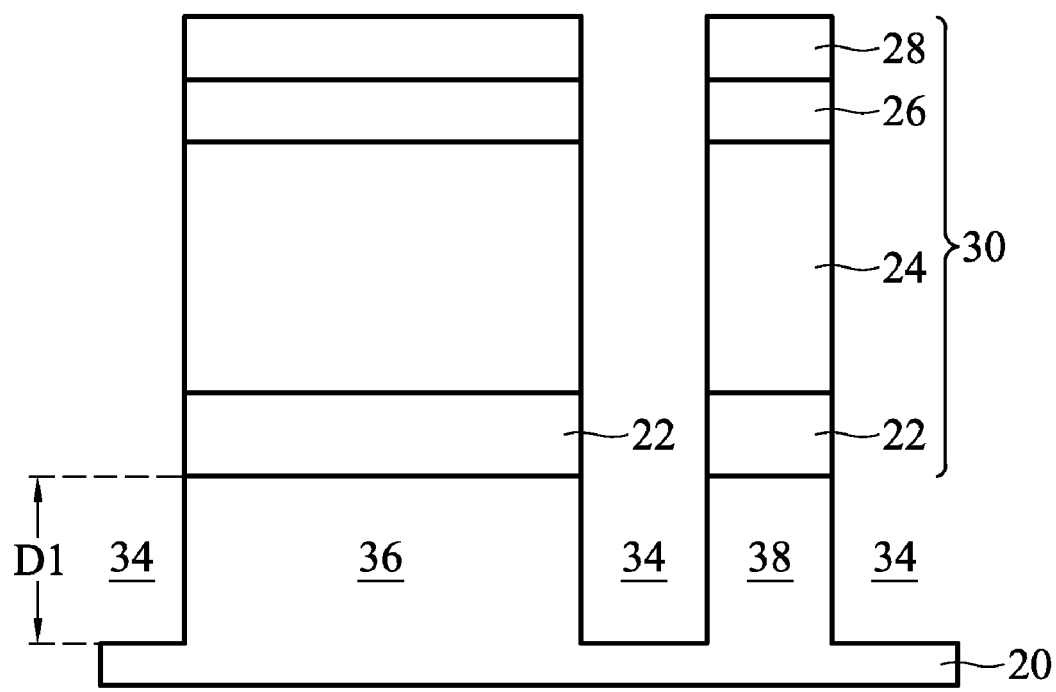

Next, hard mask 30 is patterned by etching into hard mask 30, for example, using plasma-assisted dry etching. Photo resist 32 is then removed. The resulting structure is shown in FIG. 3. The patterned hard mask 30 is then used to pattern substrate 20, resulting in trenches 34. The regions of substrate 20 covered by hard mask 30 are left un-recessed, forming active region 36 and large-pitch active region 38, while the uncovered portions are recessed. The resulting trenches 34 may encircle (in the top view) active region 36 and large-pitch active region 38. The recessing depth D1 of trenches 34 may be between about 100 nm and about 300 nm.

Figure 4:
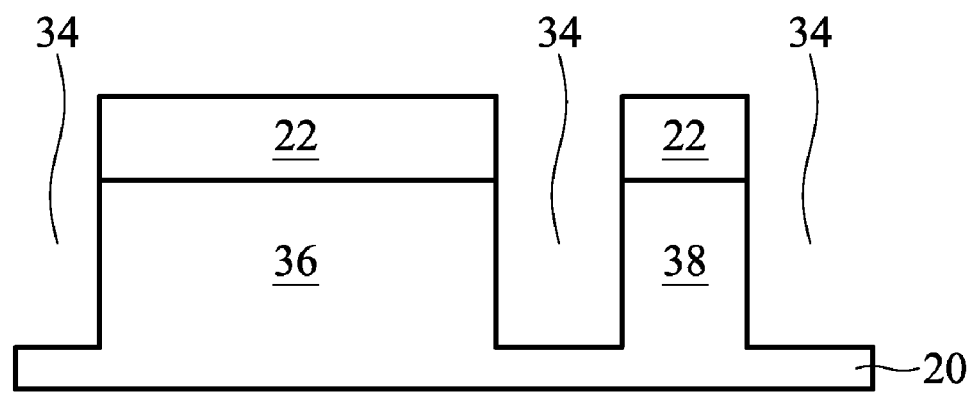
Figure 5A:
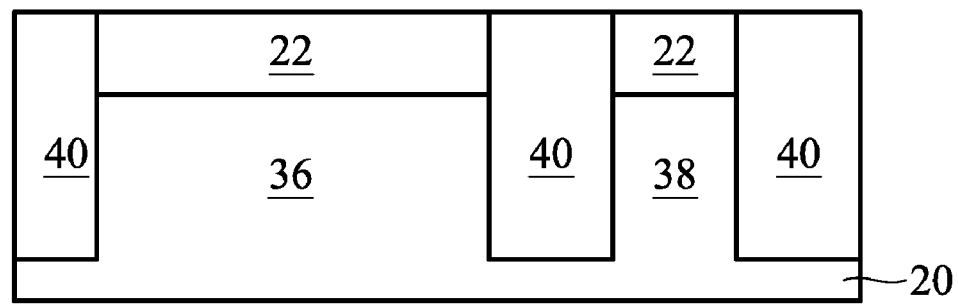
Figure 5B:
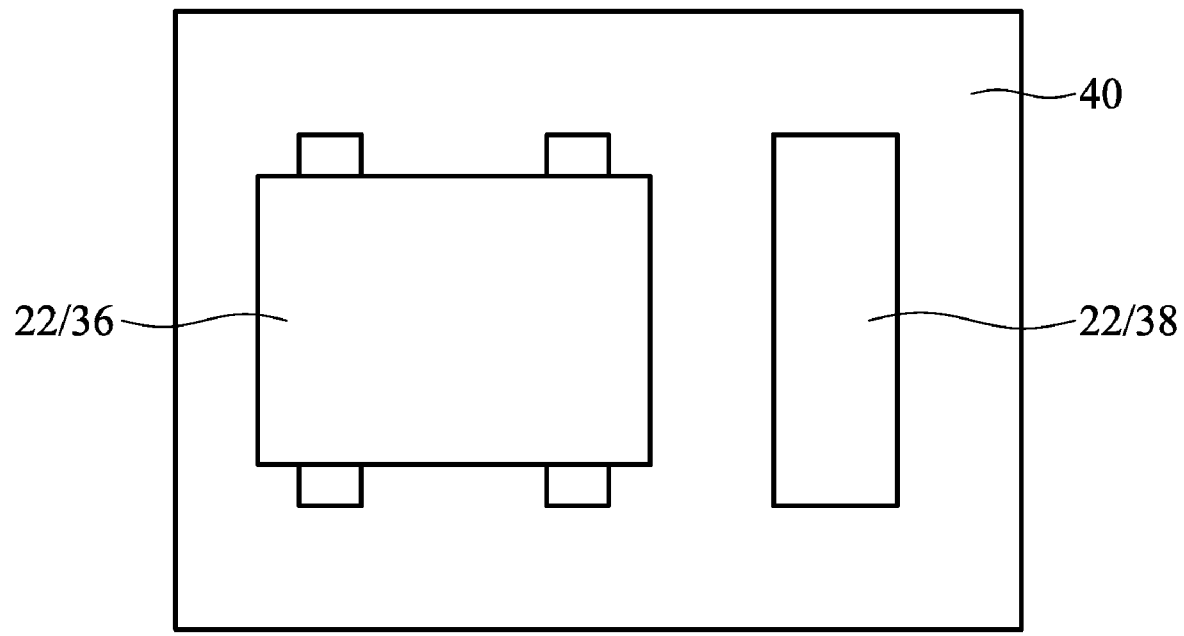

Referring to FIG. 4, a top portion of hard mask 30 is removed. For example, oxynitride layer 28, PE oxide 26, and amorphous carbon layer 24 may be removed, while silicon nitride layer 22 may be left on active regions 36 and 38. In alternative embodiments, more or fewer layers may be removed. A dielectric material is then filled into trenches 34, followed by a chemical mechanical polish (CMP) to remove the excess dielectric material over silicon nitride layer 22, leaving insulation regions 40. The resulting structure is shown in FIGS. 5A and 5B, with FIG. 5A being a cross-sectional view, and FIG. 5B being a top view. In an embodiment, insulation regions 40 are formed of spin-on dielectric (SOD) such as spin-on glass, although other dielectric materials such as silicon oxide formed using, for example, sub-atmospheric chemical vapor deposition (SACVD) may also be used.

Figure 6:
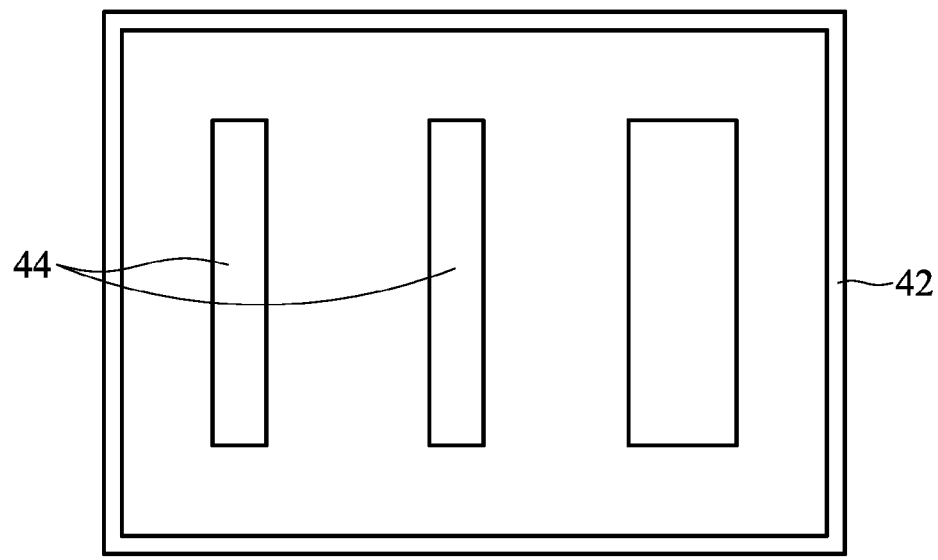
Figure 7:
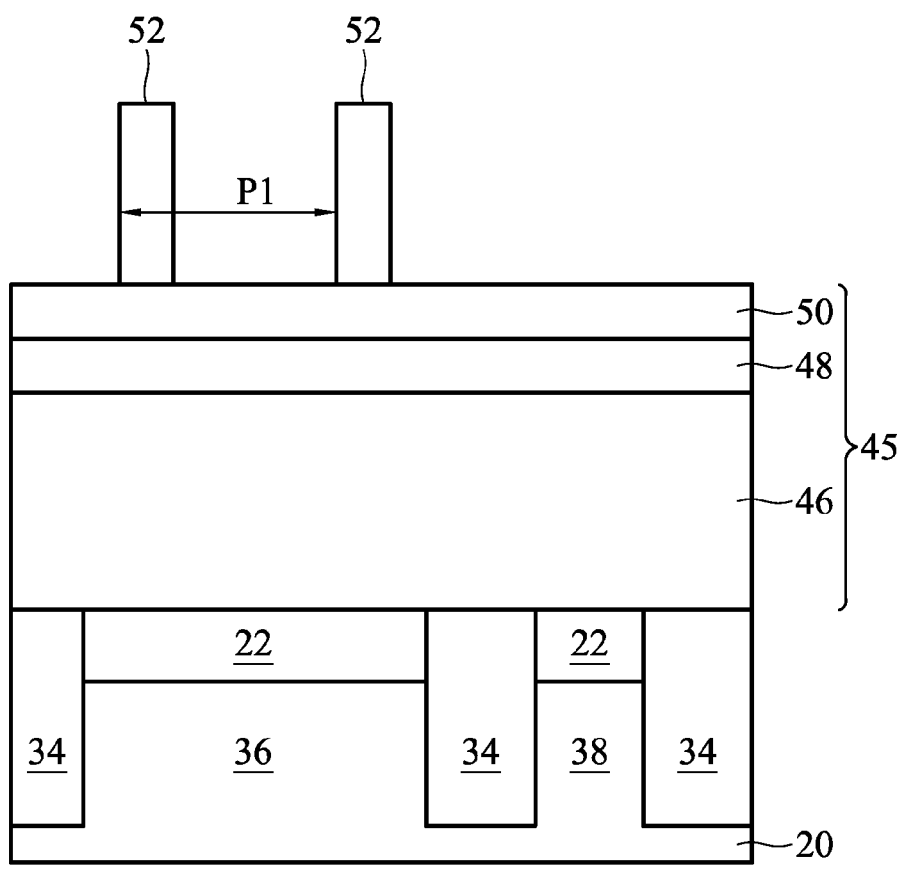
Figure 8:
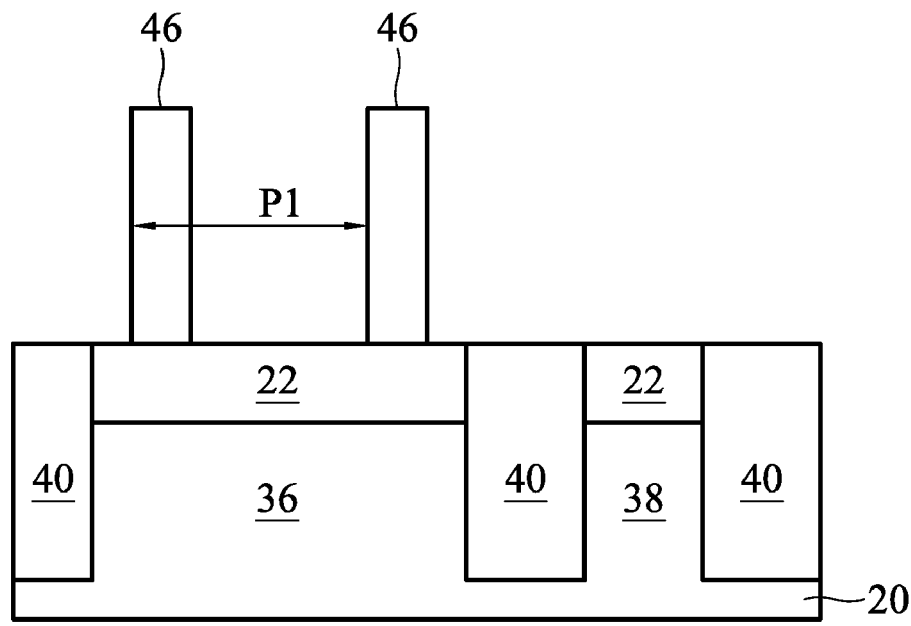

FIG. 6 through 10B illustrate the use of the second lithography mask to form masks of fins. FIG. 6 illustrates the second lithography mask 42, which includes patterns 44 that corresponds to the dotted lines 16 in first lithography mask 10 (FIG. 1A). FIG. 7 illustrates the structure formed using second lithography mask 42. In an embodiment, a second hard mask 45 including amorphous carbon layer 46 (which acts as a dummy mask layer), PE oxide 48, and silicon oxynitride layer 50 are formed on the structure shown in FIGS. 5A and 5B. Photo resist 52 is then applied and exposed using second lithography mask 42, and is then developed. Next, amorphous carbon layer 46, PE oxide 48, and silicon oxynitride layer 50 are patterned, followed by the removal of the remaining portions of PE oxide 48 and silicon oxynitride layer 50. The resulting structure is shown in FIG. 8. In the steps shown In FIGS. 7 and 8, the patterns in the second lithography mask 42 is transferred to remaining portions of amorphous carbon layer 46, which remaining portions are referred to as amorphous carbon strips 46 (which are dummy strips) hereinafter. Pitch P1 of amorphous carbon strips 46 may be less than about 100 nm. In an embodiment, pitch P1 is the minimum pitch allowed by the forming technology of the respective integrated circuit. For example, in a 32 nm technology, the minimum pitch is 100 nm, and hence pitch P1 may be close to or equal to 100 nm.

Figure 9:
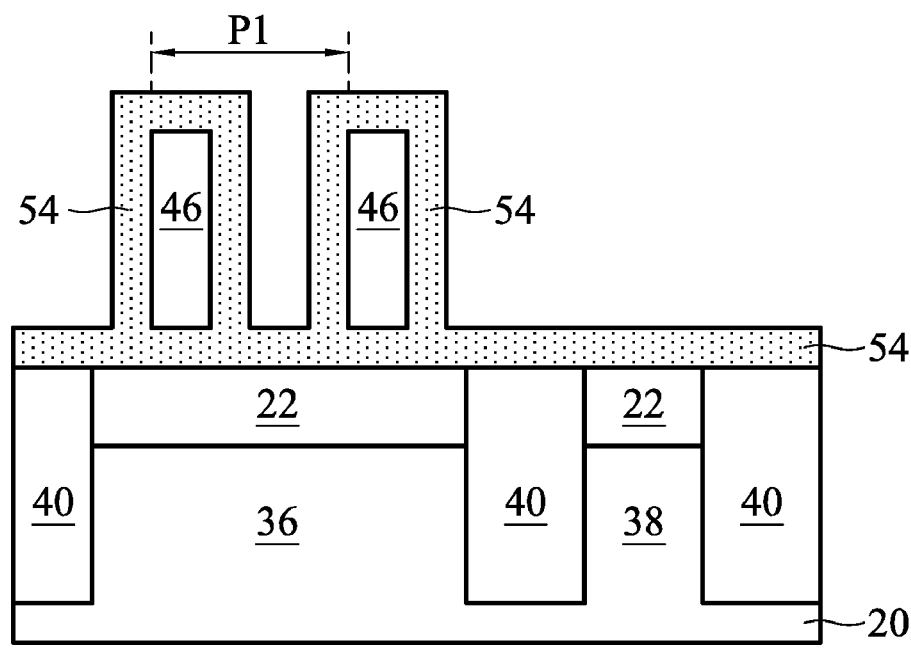

Next, as shown in FIG. 9, spacer layer 54 is deposited using a conformal deposition method. In an embodiment, spacer layer 54 is deposited using atomic layer deposition (ALD), which may form a high quality film (with a low etching rate). The thickness of spacer layer 54 may be less than a half, and possibly less than about a third, pitch P1 of amorphous carbon strips 46.

Figure 10A:
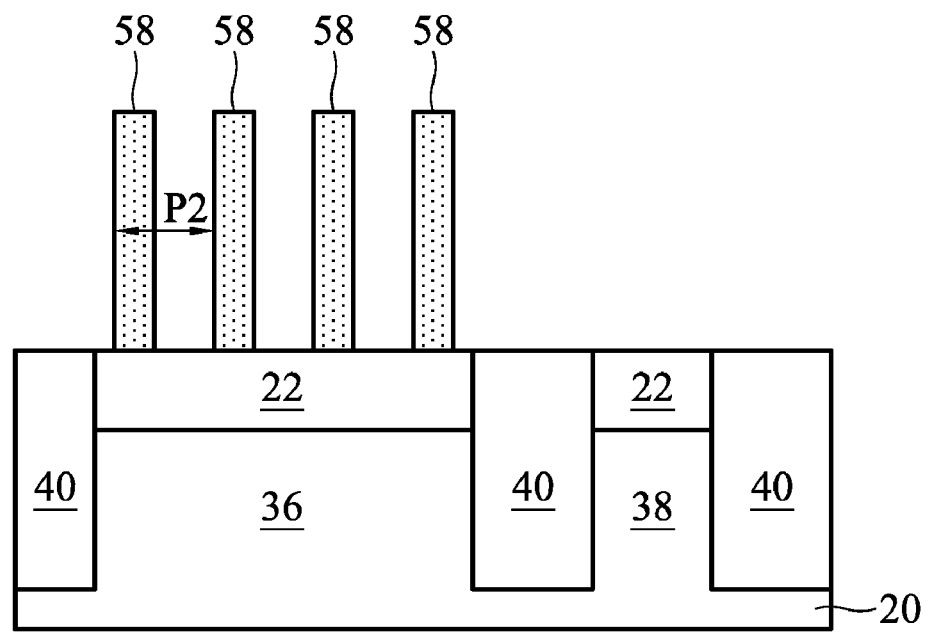
Figure 10B:
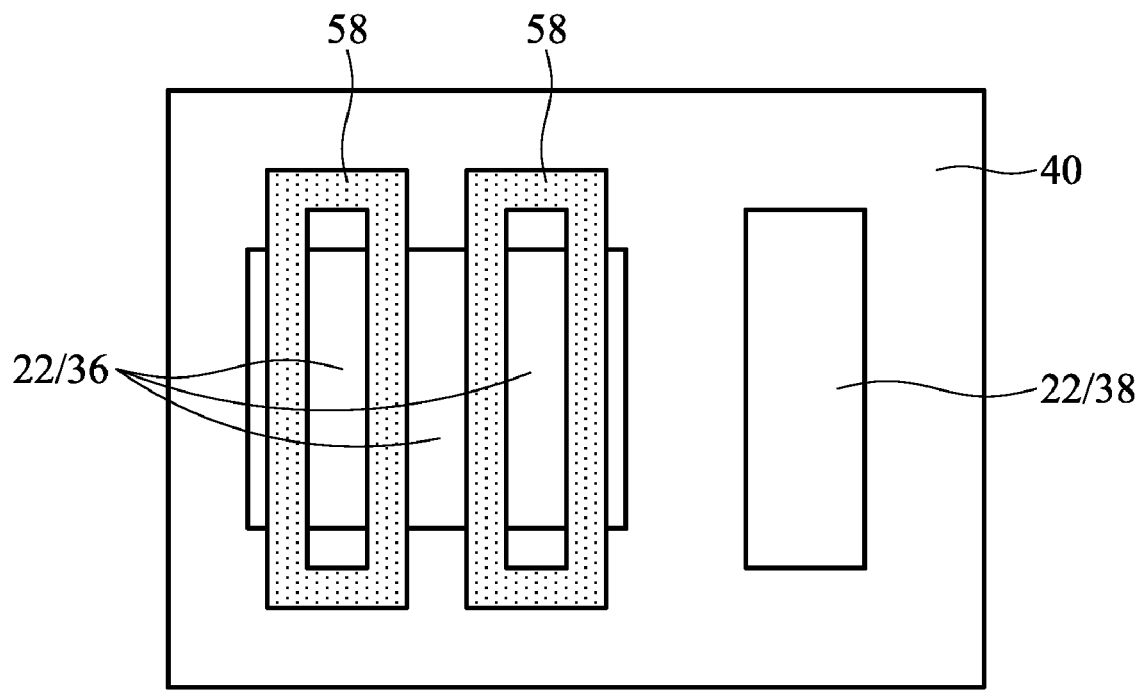

In FIG. 10A, spacer layer 54 is etched, for example, using dry etching, so that the portions of spacer layer 54 directly over amorphous carbon strips 46 are removed, and hence amorphous carbon strips 46 are exposed. Next, amorphous carbon strips 46 are removed, for example, using plasma-assisted ashing. The resulting structure is shown in FIG. 10A. The remaining portions of spacer layer 54 are used as a mask for subsequent lithography processes, and are referred to as mask strips 58. It is noted that the pitch P2 of mask strips 58 is less than pitch P1 (FIG. 8). By adjusting the thickness of spacer layer 54 (FIG. 9) and the thickness of amorphous carbon strips 46, pitch P2 may be adjusted to about a half of pitch P1. In the case pitch P1 (which is also the pitch between amorphous carbon strips 46) is already close to the minimum pitch allowed by the existing lithography technology, pitch P2 will be smaller than the minimum pitch. In an exemplary embodiment, the minimum pitch is 100 nm, and pitch P2 is about 50 nm. FIG. 10B is a top view of the structure shown in FIG. 10A.

Figure 11:
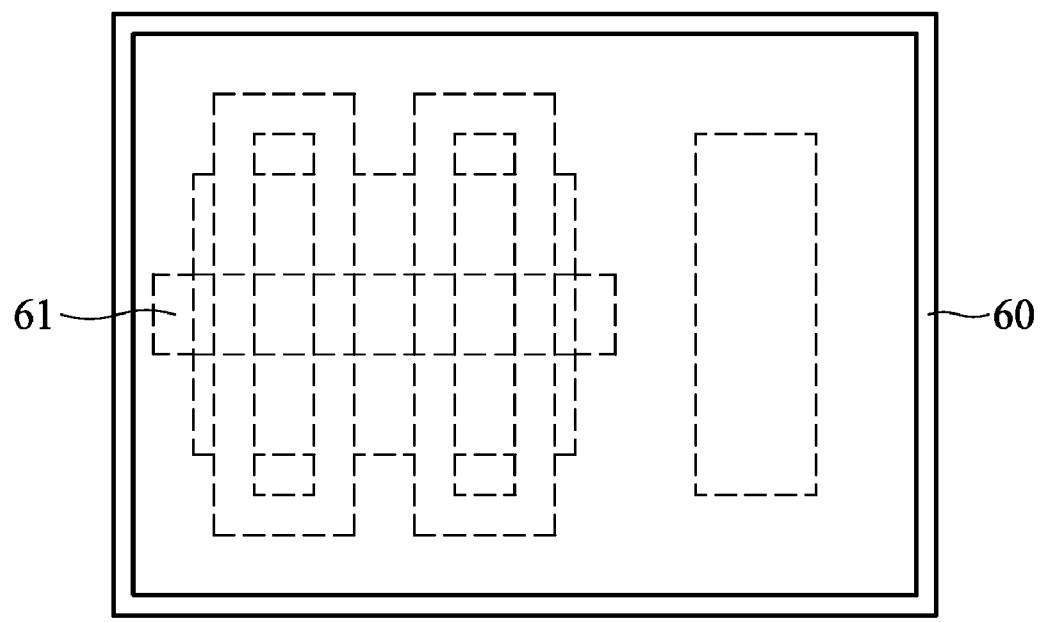
Figure 12:
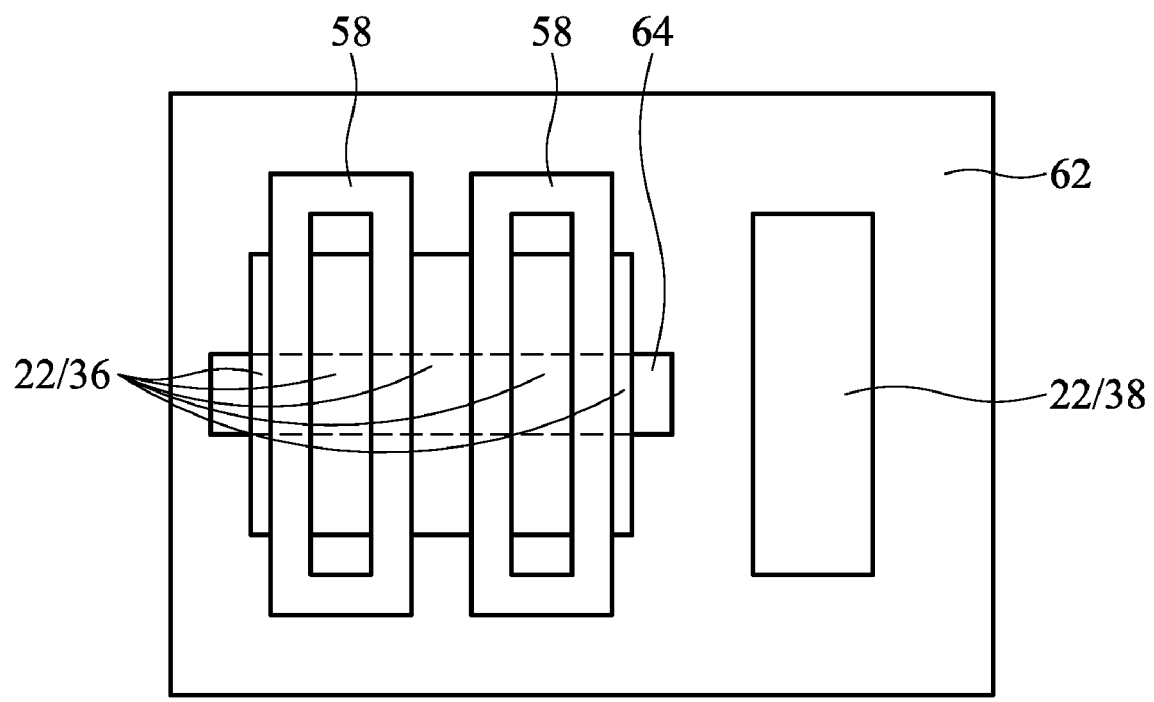

FIGS. 11 through 14B illustrate the use of the third lithography mask 60 to define the boundary of the fins of the FinFET. FIG. 11 illustrates third lithography mask 60, which comprises pattern 61, which is used to form opening 64 in FIG. 12. In FIG. 12, photo resist 62 is formed using third lithography mask 60. Photo resist 62 is over the structure shown in FIGS. 10A and 10B, with opening 64 being formed in photo resist 62. The middle portions of mask strips 58 are exposed through opening 64, while the end portions of mask strips 58 are covered by photo resist 62. Photo resist 62 is alternatively referred to as a mask layer.

Figure 13:
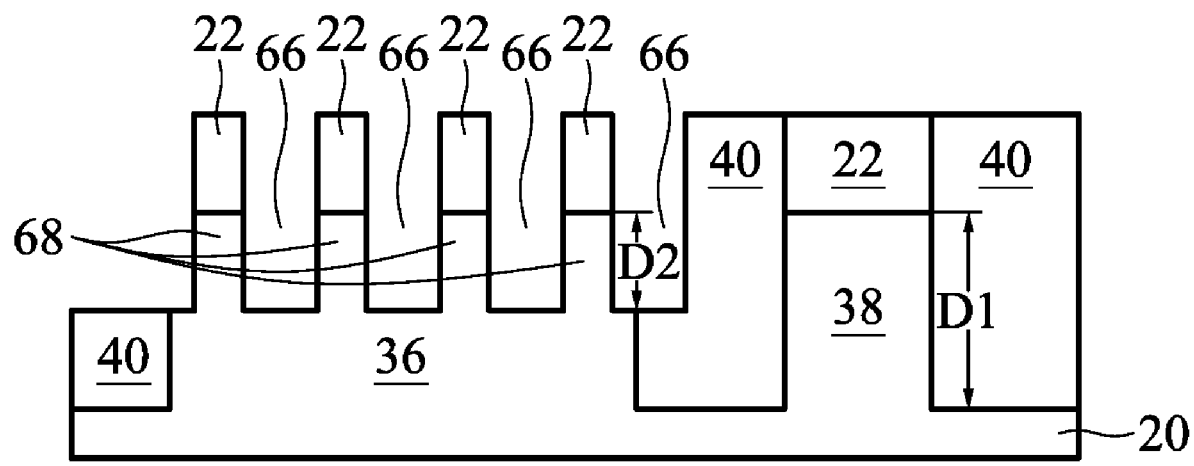
Figure 14A:
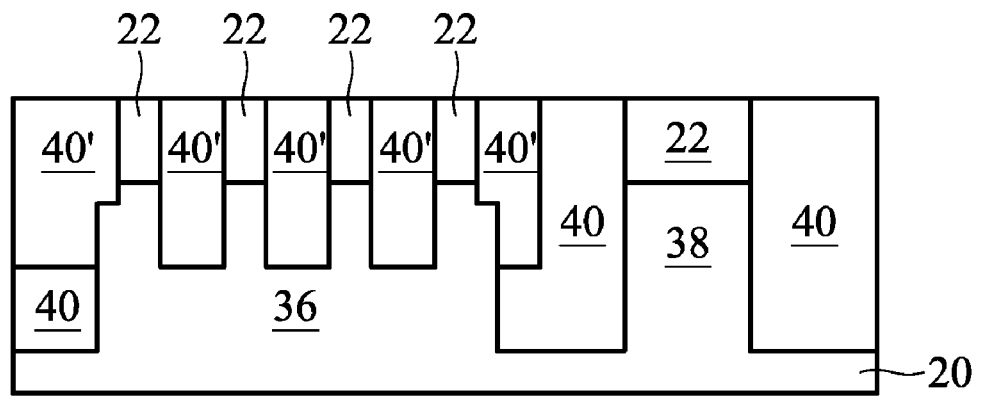
Figure 14B:
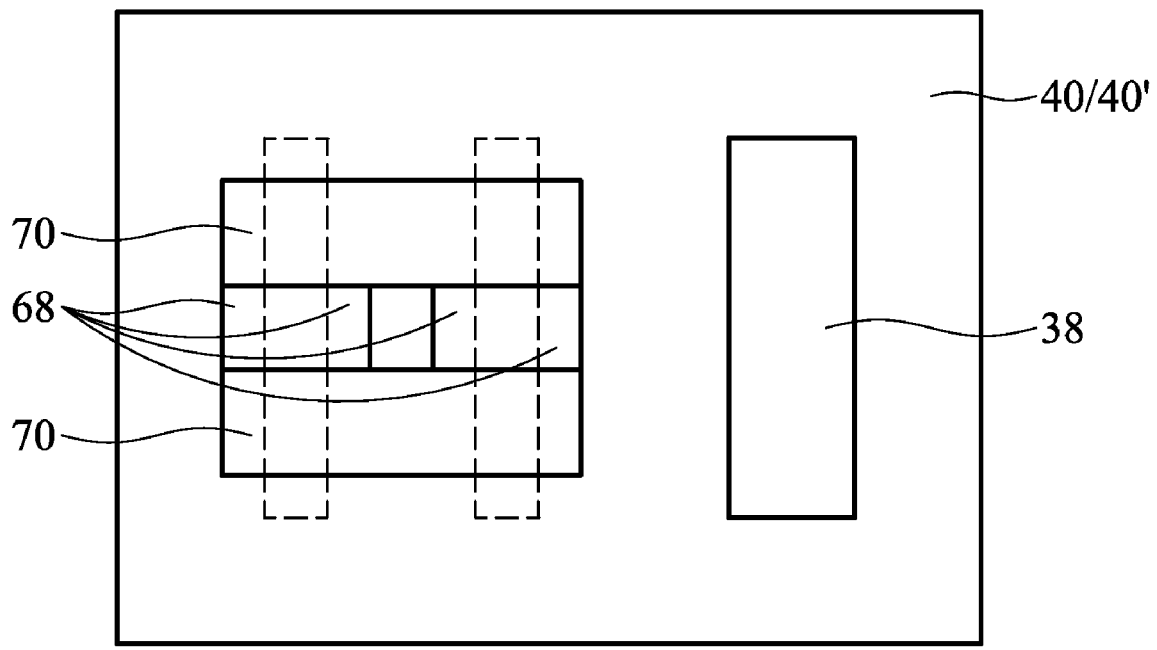

Next, using mask strips 58 and photo resist 62 as masks, exposed portions of silicon nitride layer 22 are removed, so that the underlying substrate 20 is exposed. The exposed portions of substrate 20 are then etched, forming trenches 66. Photo resist 62 and mask strips 58 are then removed. FIG. 13 illustrates a cross-section view of the resulting structure. Fins 68, which are portions of substrate 20 between trenches 66, are thus formed. Depth D2 may be between about 20 nm and about 200 nm. Depth D1 may be greater than depth D2, so that fins 68 are well insulated. Next, as shown in FIG. 14A, a dielectric material, which may be essentially the same as the material of insulation regions 40, is filled into trenches 66, followed by a planarization (such as CMP) to remove excess portions of the dielectric material. The resulting insulation regions are referred to as insulation regions 40'. FIG. 14B illustrates a top view of the structure shown in FIG. 14A. In the resulting structure, fins 68 and source/drain pads 70 are formed in active region 36. The top surface of fins 68 and source/drain pads 70 are level with the original top surface of substrate 20. Further, fins 68 and source/drain pads 70 form a continuous region. The remaining portions of silicon nitride layer 22 may then be removed.

Figure 15:
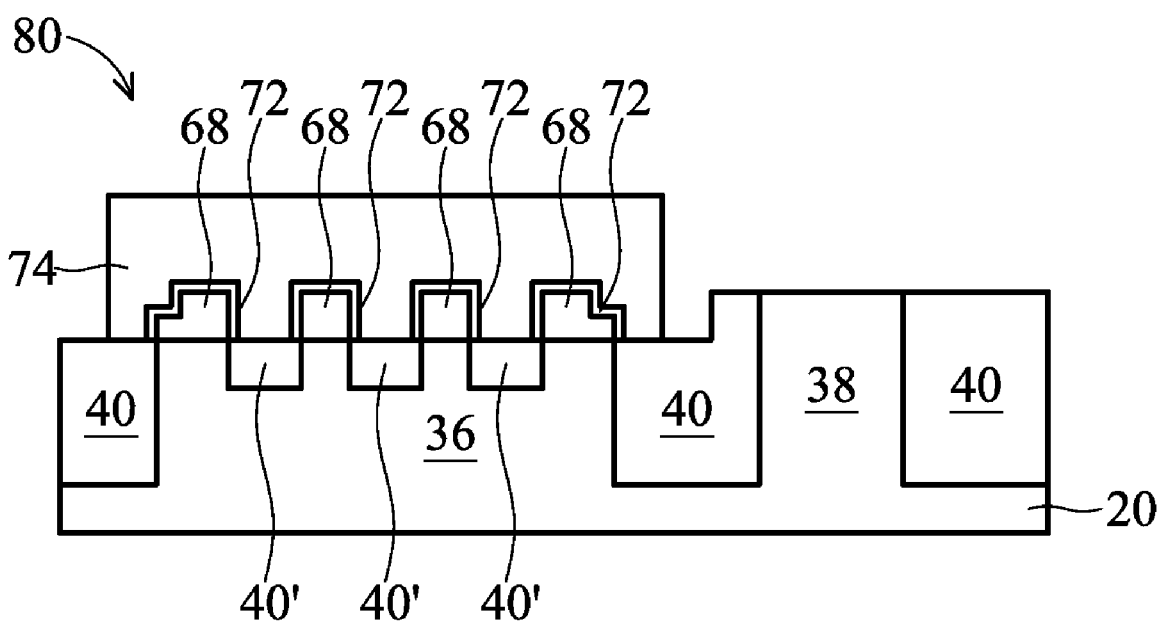

FIG. 15 illustrates the formation of FinFET 80. The formation processes include recessing dielectric regions 40 and 40' so that sidewalls of fins 68 are exposed, and forming gate dielectric 72 and gate electrode 74 on the surfaces and sidewalls of fins 68. Additional regions such as well regions, source and drain extension regions, source/drain regions, and source/drain silicides (not shown) are also formed. The structures and formation processes of these components are known in the art, and hence are not described in detail herein. The source/drain regions and the source/drain silicides are formed in and on source/drain pads 70 (FIG. 14B), respectively.

Figure 18:
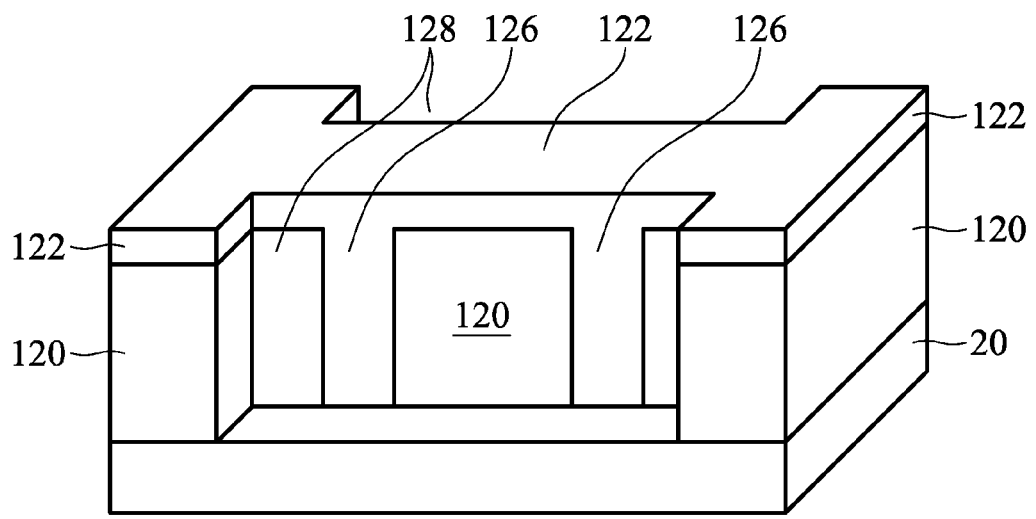
Figure 19:
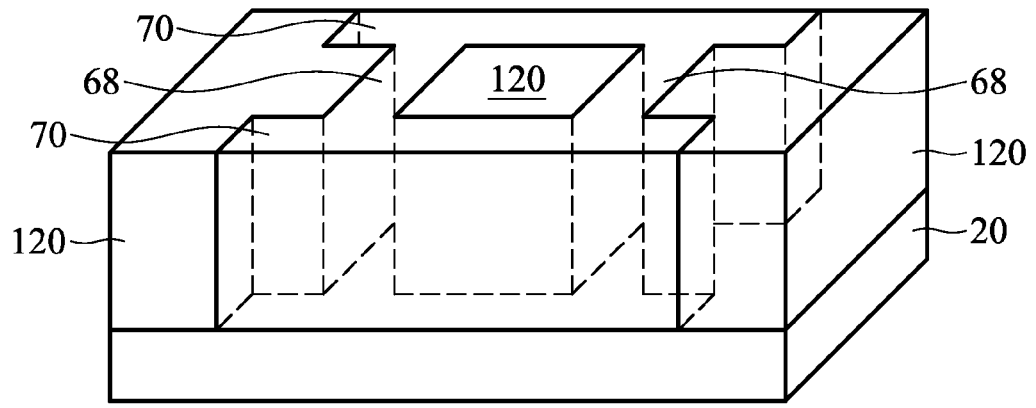
Figure 20:
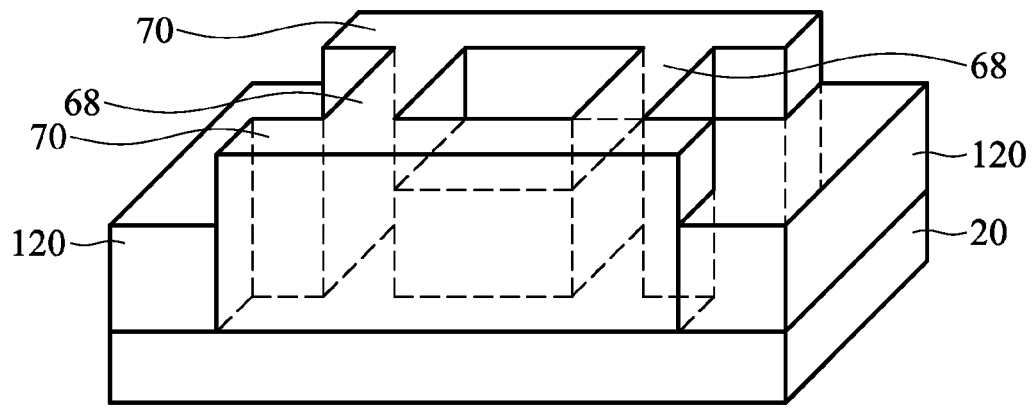

FIGS. 16 through 20 illustrate the perspective views of a second embodiment. Although the process flow of the second embodiment is different from that of the first embodiment, in the second embodiment, the source/drain pads 70 and fins 68 are also formed simultaneously, with source/drain pads 70 continuously connected to fins 68 (FIG. 20). Unless specified otherwise, like reference numerals are used to represent like elements in the first element and the second element. Accordingly, the materials and process details may not be repeated.

Figure 16:
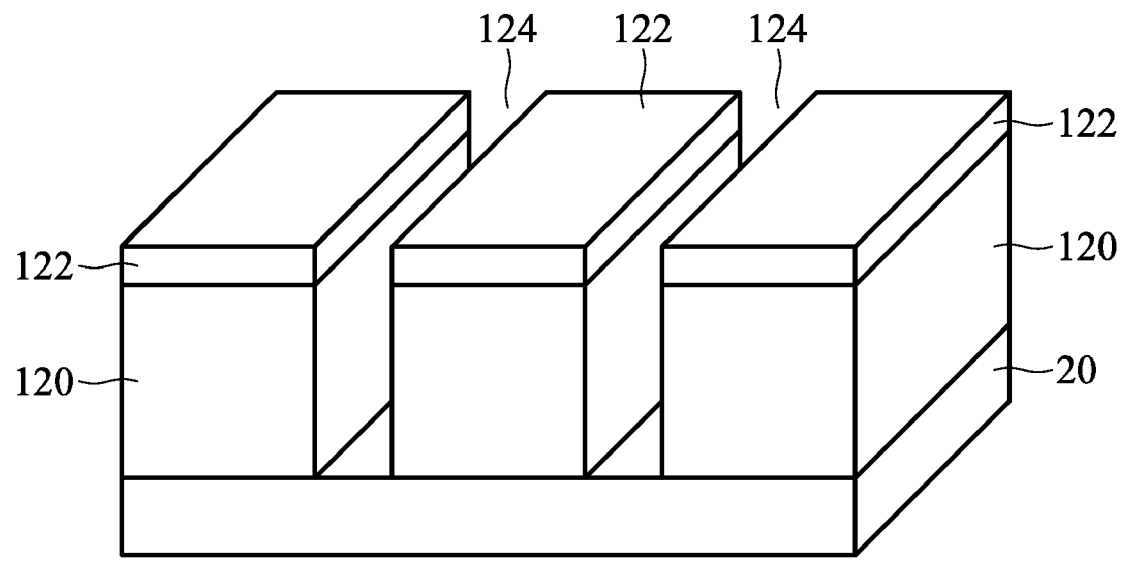
FIGS. 16 through 20 illustrate perspective views of intermediate stages in the manufacturing of a FinFET in accordance with another embodiment.

Referring to FIG. 16, substrate 20 is provided. Insulation layer 120 and first hard mask 122 are then formed on substrate 20. In an embodiment, insulation layer 120 is formed in silicon oxide, and first hard mask 122 is formed of silicon nitride. Insulation layer 120 and first hard mask 122 are then patterned using a first lithography mask (not shown), forming trenches 124 in insulation layer 120 and first hard mask 122. Trenches 124 define the shape and the location of the future fins, and are parallel to each other. The pitch of trenches 124 may be substantially equal to the minimum pitch allowed by the forming technology, although greater pitches may also be used.

Figure 17:
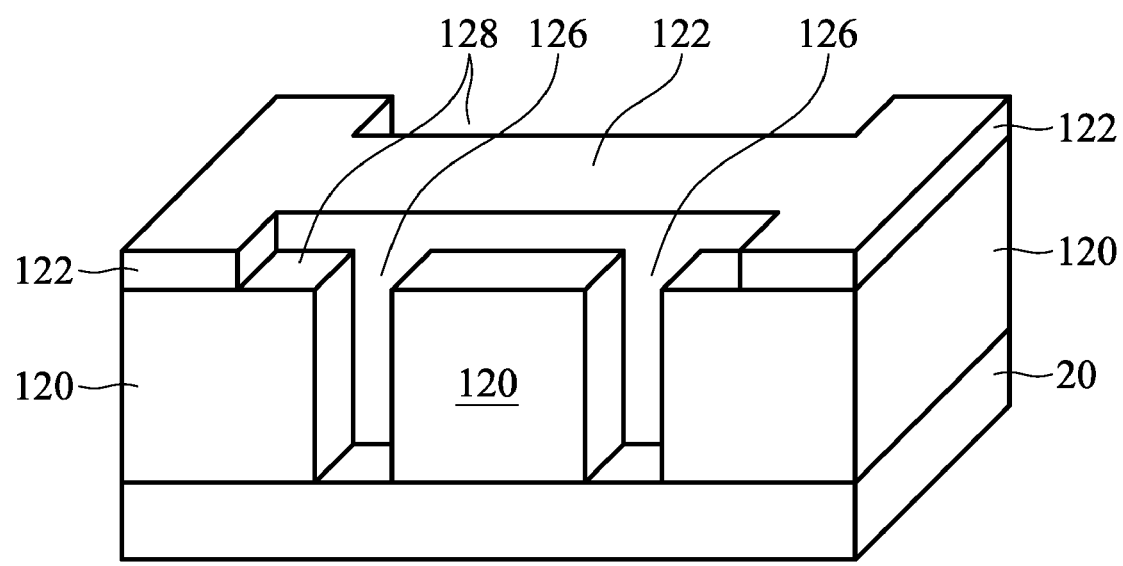

Referring to FIG. 17, a second mask 126 is formed to fill trenches 124 using a second lithography mask (not shown). A planarization may need to be performed to level the top surface of second mask 126. Next, a patterning is performed on first hard mask 122 and second mask 126, forming openings 128, so that portions of underlying insulation layer 120 are exposed.

Next, as shown in FIG. 18, the exposed portions of insulation layer 120 are etched using an anisotropic etching method, such as dry etch, so that the underlying substrate 20 is exposed. In subsequent steps, first hard mask 122 and second mask 126 are removed, while insulation layer 120 remains. The removal of first hard mask 122 and second mask 126 may be performed using an isotropic etching method, such as a wet dip. The portions of substrate 20 underlying second mask 126 will thus be exposed. Next, an epitaxy is performed to grow a semiconductor material, such as silicon, silicon germanium, or the like, from the exposed portions of substrate 20. The resulting structure is shown in FIG. 19.

In FIG. 20, insulation layer 120 is recessed, so that fins 68 and source/drain pads 70 protrude over the top surface of the remaining portions of insulation layer 120 (which now becomes the insulation regions). In subsequent process steps, a FinFET may be formed, with a gate dielectric and a gate electrode formed on the top surfaces and sidewalls of fins 68, and source/drain regions and source/drain silicides (not shown) formed on source/drain pads 70. The resulting structure is similar to the structure shown in FIG. 15.

In the second embodiment, although each of first hard mask 122 and second mask 126 are illustrated as being a single layer, they may also be replaced by multi-layer hard masks similar to hard mask 30 as shown in FIG. 2 or second hard mask 45 as shown in FIG. 7. Accordingly, the pitches between fins 68 may be further reduced, for example, to a half of the minimum pitch allowed by the forming technology. The multi-layer hard masks are advantageous in forming fins with small pitches, and the resulting fins may have sharp profiles.

The embodiments have several advantageous features. By simultaneously forming fins and source/drain pads of FinFETs, the manufacturing throughput is increased, and the manufacturing cost is reduced. In the resulting structures, semiconductor fins may have pitches less than the minimum pitch allowed by the forming technology, and hence the channel widths of the resulting FinFETs are further increased without causing the increase in the chip area occupied by the FinFETs.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming an integrated circuit structure, the method comprising:
   providing a semiconductor substrate;
   providing a first lithography mask, a second lithography mask, and a third lithography mask;
   forming a first mask layer over the semiconductor substrate, wherein a pattern of the first mask layer is defined using the first lithography mask;
   performing a first etch to form first trenches in the semiconductor substrate to define an active region using the first mask layer;
   forming a second mask layer over the semiconductor substrate and over the active region, wherein a pattern of the second mask layer is defined using the second lithography mask, and wherein the second mask layer comprises a plurality of mask strips parallel to each other;
   forming a third mask layer over the second mask layer, wherein a pattern of the third mask layer is defined using the third lithography mask, and wherein a middle portion of the plurality of mask strips is exposed through an opening in the third mask layer, and end portions of the plurality of mask strips are covered by the third mask layer; and
   performing a second etch to form second trenches in the semiconductor substrate through the opening in the third mask layer.

2. The method of claim 1, wherein after the step of the second etch, portions of the active region directly underlying the middle portion of the plurality of mask strips form a plurality of fins, and wherein end portions of the active region covered by the third mask layer form source/drain pads on opposite ends of, and forming a continuous region with, the plurality of fins.

3. The method of claim 1, wherein the first mask layer is a hard mask comprising:
   an amorphous carbon layer;
   an oxide layer over the amorphous carbon layer; and
   an oxynitride layer over the oxide layer.

4. The method of claim 1, wherein the step of forming the second mask layer comprises:
   forming a dummy hard mask layer;
   patterning the dummy hard mask layer to generate dummy strips;
   forming a spacer layer on top surfaces and sidewalls of the dummy strips;
   removing portions of the spacer layer directly over the top surfaces of the dummy strips; and
   removing the dummy strips, wherein portions of the spacer layer on the sidewalls of the dummy strips are left un-removed to form the plurality of mask strips.

5. The method of claim 1, wherein the opening in the third mask layer crosses the plurality of the plurality of mask strips in a top view of the third mask layer.

6. The method of claim 1 further comprising:
   after the step of the first etch, filling the first trenches in the semiconductor substrate with a first dielectric material;
   before the step of forming the second mask layer, planarizing the first dielectric material;
   after the step of the second etch, filling the second trenches in the semiconductor substrate with a second dielectric material;
   planarizing the second dielectric material; and
   recessing the second dielectric material.

7. The method of claim 6, wherein the first trenches are deeper than the second trenches.

8. A method of forming an integrated circuit structure, the method comprising:
   providing a semiconductor substrate;
   performing a first etch to the semiconductor substrate to form first trenches, wherein a portion of the semiconductor substrate defined by the first trenches forms an active region;
   filling the first trenches with a first dielectric material;
   forming a plurality of mask strips parallel to each other and directly over the active region;
   covering end portions of the plurality of mask strips with a mask layer, wherein a middle portion of the plurality of mask strips is not covered by the mask layer;
   performing a second etch to the active region to form second trenches using the middle portion of the plurality of mask strips and the mask layer as masks, wherein portions of the active region directly under the middle portion of the plurality of mask strips form a plurality of fins;
   filling the second trenches with a second dielectric material;
   recessing the second dielectric material to expose sidewalls of the plurality of fins;
   forming a gate dielectric layer on top surfaces and the sidewalls of the plurality of fins; and
   forming a gate electrode over the gate dielectric layer and directly over the plurality of fins.

9. The method of claim 8 further comprising, before the step of performing the first etch:
   forming an additional mask layer over the semiconductor substrate and comprising:
   forming an amorphous carbon layer;
   forming an oxide layer over the amorphous carbon layer; and
   forming an oxynitride layer over the oxide layer; and
   patterning the additional mask layer to form patterns for the first trenches.

10. The method of claim 9 further comprising, before the step of filling the first trenches, removing the amorphous carbon layer and the oxide layer, wherein the oxynitride layer remains over the active region.

11. The method of claim 8, wherein the first trenches have a greater depth than the second trenches.

12. The method of claim 8, wherein the step of forming the plurality of mask strips comprises:
   forming a dummy hard mask layer;
   patterning the dummy hard mask layer to generate dummy strips;
   forming a spacer layer on top surfaces and sidewalls of the dummy strips;
   removing portions of the spacer layer directly over the top surfaces of the dummy strips; and
   removing the dummy strips, wherein sidewall portions of the spacer layer on the sidewalls of the dummy strips are left un-removed and form the plurality of mask strips.

13. The method of claim 8, wherein the mask layer comprises an opening, with the middle portion of the plurality of mask strips exposed through the opening, and wherein the opening crosses the plurality of mask strips in a top view of the mask layer.

14. The method of claim 13, wherein after the step of the second etch, portions of the active region directly underlying the middle portion of the plurality of mask strips form the plurality of fins, and wherein end portions of the active region covered by the mask layer form source/drain pads on opposite ends of, and forming a continuous region with, the plurality of fins.

* * * * *